US008330054B2

(12) United States Patent
Honjo et al.

(10) Patent No.: US 8,330,054 B2
(45) Date of Patent: Dec. 11, 2012

(54) PRINTED CIRCUIT BOARD AND MAGNETIC HEAD DRIVING DEVICE INCLUDING THE SAME

(75) Inventors: Mitsuru Honjo, Ibaraki (JP); Daisuke Yamauchi, Ibaraki (JP); Kei Nakamura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 215 days.

(21) Appl. No.: 12/771,500

(22) Filed: Apr. 30, 2010

(65) Prior Publication Data

US 2010/0277835 A1 Nov. 4, 2010

Related U.S. Application Data

(60) Provisional application No. 61/178,625, filed on May 15, 2009.

(30) Foreign Application Priority Data

May 1, 2009 (JP) ................................ 2009-111751

(51) Int. Cl.
*H05K 1/16* (2006.01)

(52) U.S. Cl. ...... 174/260; 174/254; 361/760; 360/245.9

(58) Field of Classification Search ............... 360/245.9, 360/245.8, 245.1, 245.3, 234.5
See application file for complete search history.

(56) References Cited

U.S. PATENT DOCUMENTS

| | | | | |
|---|---|---|---|---|
| 7,319,573 | B2 * | 1/2008 | Nishiyama | 360/245.9 |
| 2002/0100609 | A1 | 8/2002 | Ookawa et al. | |
| 2004/0246626 | A1 | 12/2004 | Wakaki et al. | |
| 2004/0264056 | A1 * | 12/2004 | Jang et al. | 360/245.9 |
| 2009/0195935 | A1 * | 8/2009 | Choi | 360/245.4 |
| 2009/0260859 | A1 * | 10/2009 | Pai et al. | 174/254 |

FOREIGN PATENT DOCUMENTS

| | | | |
|---|---|---|---|
| JP | 2002-158411 | A | 5/2002 |
| JP | 2002222578 | A | 8/2002 |
| JP | 2004-363205 | A | 12/2004 |
| JP | 2006-100384 | A | 4/2006 |
| JP | 2007-335455 | A | 12/2007 |
| JP | 2009-004053 | A | 1/2009 |

OTHER PUBLICATIONS

Decision to Grant a Patent issued Oct. 16, 2012 in JP Application No. 2009-111751.

* cited by examiner

*Primary Examiner* — Ishwarbhai Patel

(74) *Attorney, Agent, or Firm* — Panitch Schwarze Belisario & Nadel LLP

(57) ABSTRACT

A plurality of wiring traces are formed on a base insulating layer, and a metal layer is formed on the opposite surface of the base insulating layer. Two adjacent wiring traces constitute a transmission line pair. The width of the wiring trace is set to not more than 250 μm, and the distance between the adjacent wiring traces is set to not less than 8 μm. The thickness of the base insulating layer is selected to cause differential impedance of the transmission line pair to be not less than 10 Ω and not more than 50 Ω.

6 Claims, 6 Drawing Sheets

F I G. 2
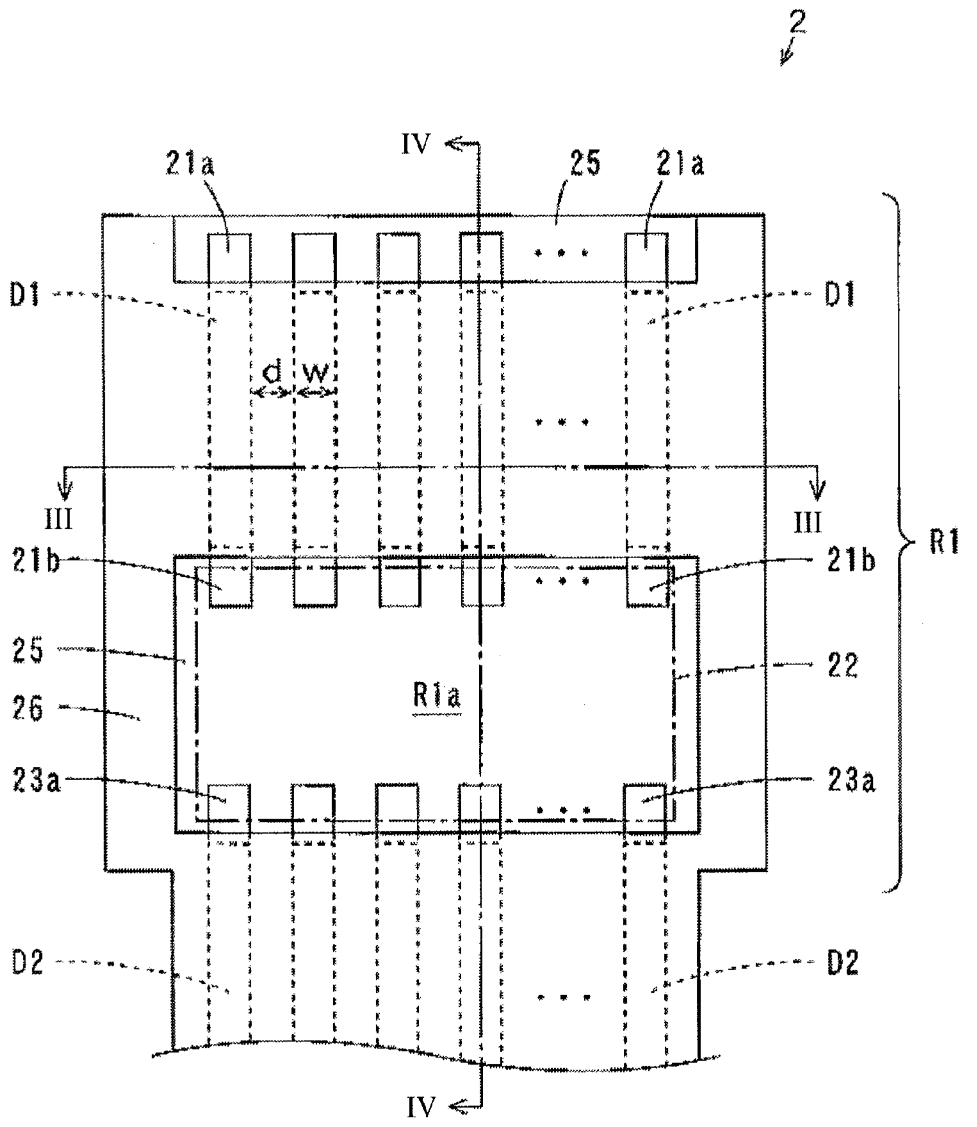

F I G. 3
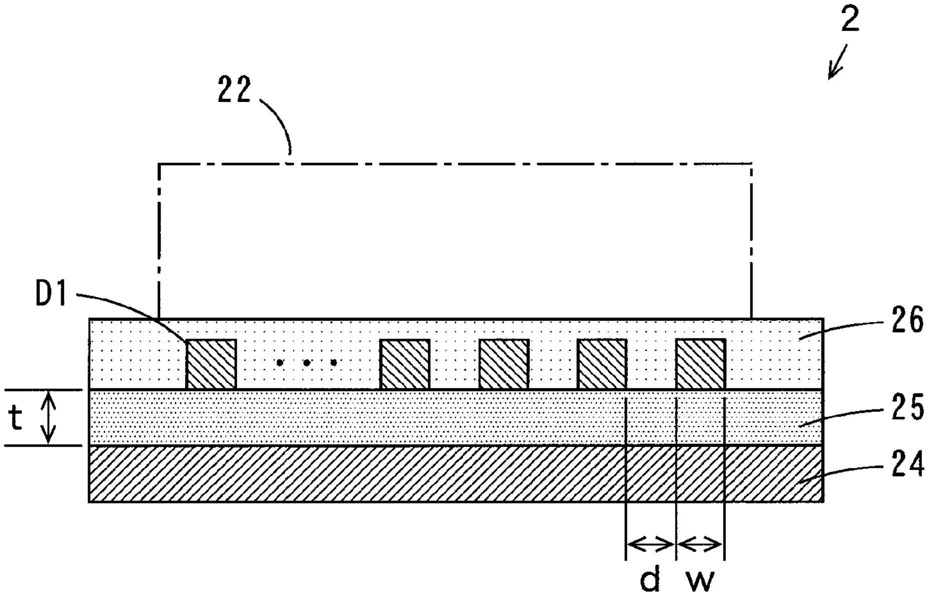
F I G. 4
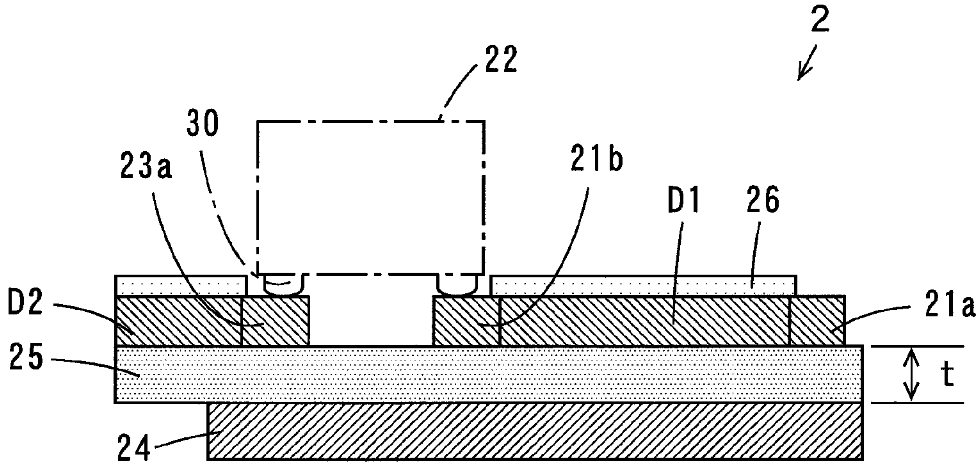

F I G. 5
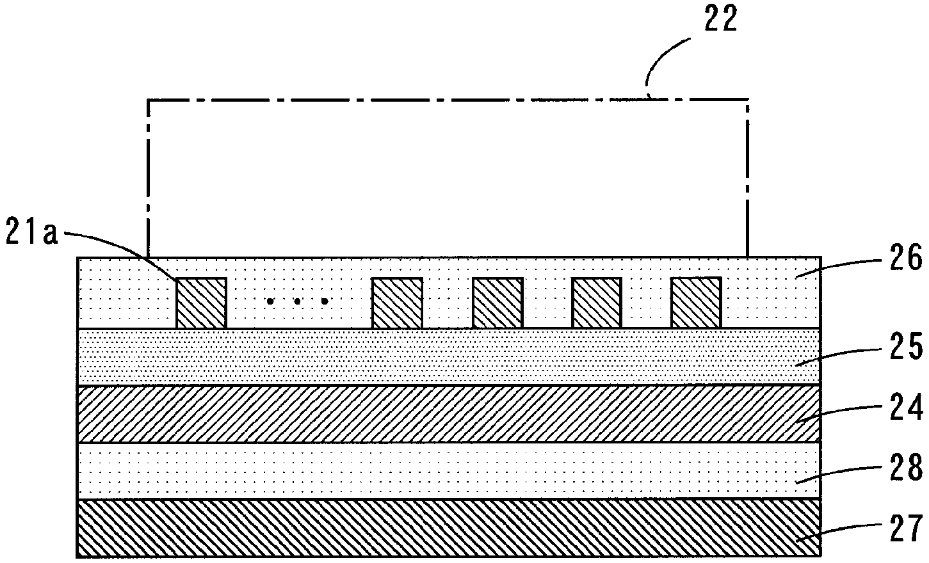

PRINTED CIRCUIT BOARD AND MAGNETIC HEAD DRIVING DEVICE INCLUDING THE SAME

BACKGROUND OF THE INVENTION

1. Field of the Invention

The present invention relates to a printed circuit board and a magnetic head driving device including the same.

2. Description of the Background Art

Actuators are employed in drives such as hard disk drives. Such an actuator includes an arm arranged rotatably with respect to a rotation shaft and a suspension board used for a magnetic head that is attached to the arm. The suspension board is a printed circuit board for positioning the magnetic head with a desired track of a magnetic disk.

A flexible printed circuit board (hereinafter referred to as printed circuit board) that can be bent is attached to the actuator. The printed circuit board has a base insulating layer with predetermined wiring traces formed thereon, for example (see JP 2009-004053 A, for example). IC (Integrated Circuit) elements such as a preamplifier are mounted on the printed circuit board. Wiring traces of the suspension board are electrically connected to the wiring traces of the printed circuit board. Electrical signals are transmitted between other electronic circuits and the magnetic head through the IC elements on the printed circuit board and through the suspension board.

In general, the IC element such as a preamplifier to be mounted on the printed circuit board has a differential output impedance of about 100Ω. In recent years, recording densities of magnetic disks have been improved and a PMR (Perpendicular Magnetic Recording) system has been introduced, resulting in a growing need for larger currents for writing. This increases power consumption of the IC elements, and therefore development for IC elements with reduced power consumption has been promoted. With the development, lower power consumption for driving the IC elements is required also in the printed circuit board on which the IC elements are to be mounted.

SUMMARY OF THE INVENTION

An object of the present invention is to provide a printed circuit board capable of reducing power consumption for driving mounted circuit elements and a magnetic head driving device including the same.

(1) According to an aspect of the present invention, a printed circuit board on which a circuit element is mounted and to which an external circuit is connected includes a first insulating layer having a mounting region, in which the circuit element is mounted, on one surface, a plurality of first connection terminals that are formed in a region, which excludes the mounting region, on the one surface of the first insulating layer and that can be connected to the external circuit, a plurality of second connection terminals that are formed in the mounting region on the one surface of the first insulating layer and that can be connected to a plurality of terminals of the circuit element, respectively, a plurality of conductor lines that are formed to extend between the plurality of first connection terminals and the plurality of second connection terminals on the one surface of the first insulating layer, and a conductive layer that is formed in a region on the other surface of the first insulating layer that is opposite to a region on the one surface of the first insulating layer including the plurality of conductor lines, wherein adjacent conductor lines constitute a transmission line pair, a width of each conductor line is set to not more than 250 μm, a distance between the adjacent conductor lines is set to not less than 8 μm, and differential impedance of the transmission line pair is not less than 10Ω and not more than 50Ω.

In the printed circuit board, the differential impedance of the transmission line pair is set to not less than 10Ω. This allows lower capacitive components of the transmission line pair, thereby reducing delays of high-frequency signals transmitted through the transmission line pair. The differential impedance of the transmission line pair is set to not more than 50Ω. This lowers power consumption of the printed circuit board.

The width of each conductor line is set to not more than 250 μm. This prevents connection of connecting wires or the terminals to the first or second connection terminals by heat from being difficult because of heat dissipation from the conductor lines.

Furthermore, the distance between the adjacent conductor lines is set to not less than 8 μm. This prevents lower insulation resistance between the conductor lines caused by ion migration.

Accordingly, the thickness of the first insulating layer is appropriately selected, so that the differential impedance of the transmission line pair can be not less than 10Ω and not more than 50 Ω.

As a result, insulation reliability between the conductor lines can be ensured and the differential impedance of the transmission line pair can be decreased.

(2) A thickness of the first insulating layer may be not less than 4 μm and not more than 30 pm. In this case, durability and flexibility of the first insulating layer can be ensured, and the differential impedance of the transmission line pair can be sufficiently decreased.

(3) The printed circuit board may further include a metal plate provided on one surface of the conductive layer.

In this case, better durability of the first insulating layer can be ensured, and the differential impedance of the transmission line pair can be sufficiently decreased.

(4) The printed circuit board may further include a second insulating layer formed on the one surface of the first insulating layer to cover the plurality of conductor lines.

In this case, corrosion resistance of the conductor lines can be ensured, and the differential impedance of the transmission line pair can be sufficiently decreased.

(5) The first insulating layer may be made of polyimide. In this case, sufficient flexibility of the first insulating layer can be ensured, and the differential impedance of the transmission line pair can be sufficiently decreased.

(6) According to another aspect of the present invention, a magnetic head driving device includes a printed circuit board, an amplifier having a plurality of terminals, a suspension board with a circuit, and a magnetic head provided in the suspension board with the circuit, wherein the printed circuit board includes an insulating layer having a mounting region on one surface, a plurality of first connection terminals formed in a region, which excludes the mounting region, on the one surface of the insulating layer and that can be connected to the suspension board with the circuit, a plurality of second connection terminals formed in the mounting region on the one surface of the insulating layer, a plurality of conductor lines that are formed to extend between the plurality of first connection terminals and the plurality of second connection terminals on the one surface of the insulating layer, and a conductive layer formed in a region on the other surface of the insulating layer so as to be opposite to a region on the one surface of the insulating layer including the plurality of conductor lines, adjacent conductor lines constitute a transmission line pair, a width of each conductor line is set to not more than 250 μm, a distance between the adjacent conductor lines is set to not less than 8 μm, and differential impedance of the transmission line pair is not less than 10Ω and not more than 50Ω, the amplifier is mounted in the mounting region of the insulating layer, the plurality of terminals of the amplifier are connected to the plurality of second connection terminals, and the magnetic head is electrically connected to the plurality of first connection terminals through the suspension board with the circuit.

In the magnetic head driving device, the plurality of conductor lines are formed to extend between the plurality of first connection terminals and the second connection terminals on the printed circuit board, respectively. The amplifier is mounted in the mounting region of the printed circuit board, and the plurality of terminals of the amplifier are connected to the plurality of second connection terminals, respectively. In addition, the magnetic head is provided in the suspension board with the circuit, and is connected to the plurality of first connection terminals of the printed circuit board through the suspension board with the circuit.

Accordingly, write signals to be written in a magnetic disk that are input to the amplifier are amplified by the amplifier to be supplied to the magnetic head through the second connection terminals, the conductor lines, the first connection terminals and the suspension board with the circuit. Read signals from the magnetic disk that are output from the magnetic head are supplied to the amplifier through the suspension board with the circuit, the first connection terminals, the conductor lines and the second connection terminals to be amplified by the amplifier. In this manner, the write signals and the read signals are transmitted between the amplifier and the magnetic head.

In the printed circuit board, the differential impedance of the transmission line pair is set to not less than 10Ω. This allows lower capacitive components of the transmission line pair, thereby reducing delays of high-frequency signals transmitted through the transmission line pair. The differential impedance of the transmission line pair is set to not more than 50Ω. This lowers power consumption of the printed circuit board.

The width of each conductor line is set to not more than 250 μm. This prevents difficulty of connecting the conductor lines or the terminals to the first or second connection terminals by heat due to heat dissipation from the conductor lines.

Furthermore, the distance between the adjacent conductor lines is set to not less than 8 μm. This prevents lower insulation resistance between the conductor lines due to ion migration.

Accordingly, the thickness of the insulating layer is appropriately selected, so that the differential impedance of the transmission line pair can be not less than 10Ω and not more than 50Ω.

As a result, insulation reliability between the conductor lines can be ensured and the differential impedance of the transmission line pair of the printed circuit board can be decreased.

According to the present invention, power consumption for driving the mounted circuit elements can be decreased.

Other features, elements, characteristics, and advantages of the present invention will become more apparent from the following description of preferred embodiments of the present invention with reference to the attached drawings.

BRIEF DESCRIPTION OF THE DRAWINGS

FIG. 2 is a schematic plan view of an arm fixing region of a printed circuit board.

FIG. 3 is a sectional view of the printed circuit board of FIG. 2 taken along the line III-III.

FIG. 4 is a sectional view of the printed circuit board of FIG. 2 taken along the line IV-IV.

FIG. 5 is a schematic sectional view of the printed circuit board of a modification.

DESCRIPTION OF THE PREFERRED EMBODIMENTS

Figure 1:
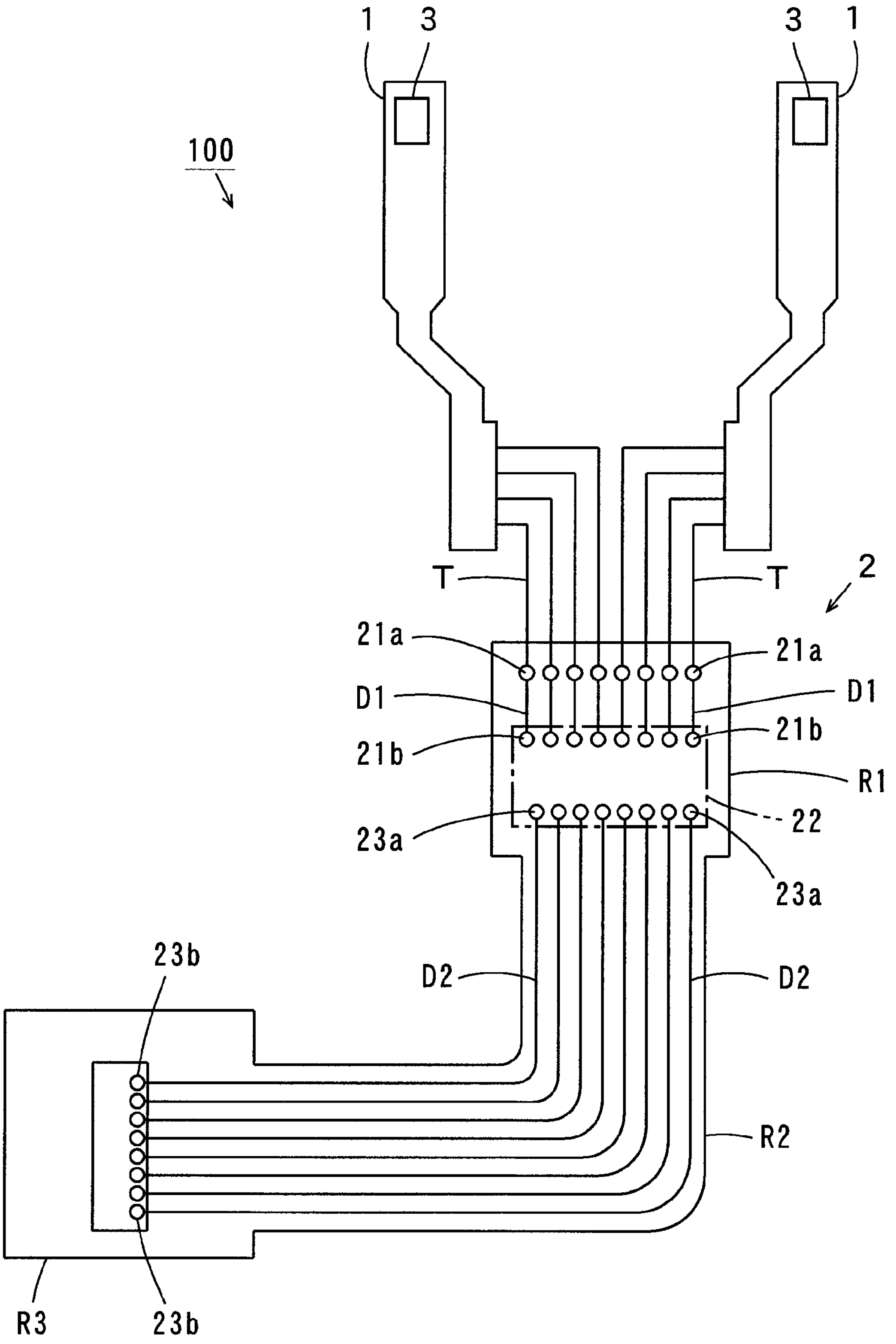
FIG. 1 is a schematic plan view showing the schematic configuration of a magnetic head driving device according to the present embodiment.

Description will be made of a printed circuit board and a magnetic head driving device according to embodiments of the present invention while referring to the drawings. Note that the magnetic head driving device described below is provided in an actuator in a hard disk drive.

(1) Embodiment (1-1) General Configuration of Magnetic Head Driving Device

FIG. 1 is a schematic plan view showing the schematic configuration of a magnetic head driving device according to the present embodiment. As shown in FIG. 1, the magnetic head driving device 100 includes a plurality of suspension boards with circuits (hereinafter referred to as suspension boards) 1 and a flexible printed circuit board (hereinafter referred to as a printed circuit board) 2. The plurality of suspension boards 1 and the printed circuit board 2 are attached to an arm of an actuator that is not shown.

A magnetic head 3 is attached to one end of each suspension board 1. Read wiring traces and write wiring traces are formed on each suspension board 1, as described below. The magnetic head 3 is electrically connected to the read wiring traces and the write wiring traces.

The printed circuit board 2 includes an arm fixing region R1, a bent region R2 and a connection region R3. The printed circuit board 2 is bent at the bent region R2. In the state, the arm fixing region R1 is fixed to the arm of the actuator, and the connection region R3 is connected to another electronic circuit, not shown, in the hard disk.

A plurality of connection pads 21*a* are provided in the arm fixing region R1. The read wiring traces and the write wiring traces of the plurality of suspension boards 1 are electrically connected to the plurality of connection pads 21*a* through a plurality of connecting wires T, respectively.

A plurality of wiring traces D1 are formed on the arm fixing region R1 to extend from the plurality of connection pads 21*a*, respectively. Connection pads 21*b* are formed at the other ends of the plurality of wiring traces D1, respectively. In addition, a plurality of wiring traces D2 are formed to extend from the arm fixing region R1 to the connection region R3 via the bent region R2. Connection pads 23*a* are formed at one ends of the plurality of wiring traces D2, respectively. A preamplifier 22 is mounted in the arm fixing region R1 to be electrically connected to the connection pads 21*b*, 23*a*.

A plurality of connection pads 23*b* are formed at the other ends of the plurality of wiring traces D2 in the connection region R3, respectively. The plurality of connection pads 23*b* are connected to the another electronic circuit, not shown, in the hard disk.

A write signal representing information to be written in a magnetic disk, not shown, is input to the preamplifier 22 through the connection pads 23*b* and the wiring traces D2. The input write signal is amplified by the preamplifier 22 to be output. The write signal output from the preamplifier 22 is sent to the magnetic heads 3 through the wiring traces D1, the connecting wires T and the write wiring traces of the suspension boards 1.

A read signal representing information read from the magnetic disk is input from the magnetic heads 3 to the preamplifier 22 through the read wiring traces of the suspension boards 1, the connecting wires T and the wiring traces D1. The input read signal is amplified by the preamplifier 22 to be output. The read signal output from the preamplifier 22 is transmitted to the another electronic circuit, not shown, through the wiring traces D2 and the connection pads 23*b*.

(1-2) The Printed Circuit Board (1-2-1) Configuration of the Printed Circuit Board Description will be made of the configuration of the printed circuit board 2. FIG. 2 is a schematic plan view of the arm fixing region R1 of the printed circuit board 2. FIGS. 3 and 4 are sectional views of the printed circuit board 2 of FIG. 2 taken along the line III-III and the line IV-IV, respectively.

As shown in FIG. 2, the plurality of connection pads 21*a* are arranged along one side of the arm fixing region R1. The plurality of connecting wires T (see FIG. 1) are electrically connected to the plurality of connection pads 21*a* corresponding thereto. A preamplifier mounting region R1*a* is provided in the arm fixing region R1. The plurality of connection pads 21*b* and the plurality of connection pads 23*a* are arranged within the preamplifier mounting region R1*a* along two opposite sides thereof, respectively. The plurality of wiring traces D1 extend between the plurality of connection pads 21*a* and the plurality of connection pads 21*b*, respectively. The adjacent wiring traces D1 are arranged at a distance d from one another, and each wiring trace D1 has a width w.

As shown in FIGS. 2 to 4, the printed circuit board 2 includes a base insulating layer 25 made of polyimide. The wiring traces D1 made of copper are formed at regular intervals on the base insulating layer 25 while the wiring traces D2 are formed at regular intervals on the base insulating layer 25. A cover insulating layer 26 made of polyimide is formed on the base insulating layer 25 to cover the wiring traces D1, D2 excluding a region in which the plurality of connection pads 21*a* are formed and the preamplifier mounting region R1*a*. Furthermore, the metal layer 24 is provided on the opposite surface of the base insulating layer 25. The metal layer 24 is formed in a region on the opposite surface of the base insulating layer 25 that corresponds to a region including the plurality of connection pads 21*a*, the plurality of wiring traces D1, the plurality of connection pads 21*b* and the plurality of connection pads 23*a*.

A plurality of terminals 30 of the preamplifier 22 are connected to the plurality of connection pads 21*b* and the plurality of connection pads 23*a* that are exposed in the preamplifier mounting region R1*a* with solder bumps sandwiched therebetween, for example. The two adjacent wiring traces D1 constitute a transmission line pair that transmits differential write signals and differential read signals. A differential impedance of each pair of wiring traces D1 is set to not less than 10Ω and not more than 50Ω.

(1-2-2) Dimensions of Components

The width w of the wiring trace D1 is not more than 250 μm. The distance d between the adjacent wiring traces D1 is not less than 8 μm, and preferably not less than 10 μm and not more than 15 μm. The thickness t of the base insulating layer 25 is preferably not less than 4 μm and not more than 30 μm, and more preferably not less than 5 μm and not more than 25 μm. Furthermore, the thickness of the cover insulating layer 26 is preferably not less than 7 μm and not more than 50 μm, and more preferably not less than 10 μm and not more than 30 μm.

(1-2-3) Reason for Setting the Foregoing Dimensions (a) The Width of the Wiring Trace The wiring trace D1 having the width w of more than 250 μm enhances its heat dissipation effect. This makes it difficult to connect the terminals 30 of the preamplifier 22 to the connection pads 21*b* on the printed circuit board 2 through with the solder bumps or the like sandwiched therebetween. Accordingly, the width w of the wiring trace D1 is set to not more than 250 μm.

(b) The Distance between the Plurality of Wiring Traces

When the distance d between the adjacent wiring traces D1 is less than 8 μm, insulation resistance is lowered due to ion migration to be generated between the adjacent wiring traces D1. Therefore, the distance d between the adjacent wiring traces D1 is set to not less than 8 μm.

(c) The Thickness of the Base Insulating Layer

The base insulating layer 25 having the thickness t of less than 4 μm makes it difficult to provide sufficient durability. Meanwhile, it is difficult to obtain sufficient flexibility in the base insulating layer 25 having the thickness t of more than 30 μm. Thus, the thickness t of the base insulating layer 25 is preferably set to not less than 4 μm and not more than 30 μm.

(d) The Thickness of the Cover Insulating Layer

The cover insulting layer 26 having the thickness of less than 7 μm lowers its function of protecting the wiring traces D1 from corrosion. Meanwhile, the cover insulating layer 26 having the thickness of more than 50 μm increases the differential impedance of the transmission line pair. Accordingly, the thickness of the cover insulating layer 26 is preferably set to not less than 7 μm and not more than 50 μm.

(1-3) Effects of the Embodiment

In the printed circuit board 2 according to the present embodiment, the width w of each wiring trace D1 is set to not more than 250 μm, and the distance d between the adjacent wiring traces D1 is set to not less than 8 μm. In addition, the thickness t of the base insulating layer 25 is selected from a range from 4 μm to 30 μm, so that the differential impedance of the transmission line pair constituted by the adjacent wiring traces D1 is set to not less than 10Ω and not more than 50Ω.

Accordingly, insulation reliability between the wiring traces D1 and the durability and flexibility of the base insulating layer 25 can be ensured, and power consumption of the transmission line pair at the time of operation of the mounted preamplifier 22 can be sufficiently decreased.

(2) Modification

Next, description will be made of a modification of the present invention. FIG. 5 is a schematic sectional view of a printed circuit board of the modification. FIG. 5 shows a cross section that is the same as the cross section of FIG. 2 taken along the line III-III. As shown in FIG. 5, the metal layer 24 provided on the base insulating layer 25 has a metal reinforcing plate 27 provided on its opposite surface with an adhesive 28 sandwiched therebetween. Note that an adhesive may be also provided between the base insulating layer 25 and the metal layer 24.

(3) Other Embodiments

Another insulating material such as epoxy instead of polyimide may be employed as the materials for the base insulating layer 25 and the cover insulating layer 26 of the printed circuit board 2, and another metal such as gold (Au) and aluminum or an alloy such as a copper alloy and an aluminum alloy instead of copper may be employed as the materials for the wiring traces D1, D2 and the metal layer 24.

(4) Correspondences between Elements in the Claims and Parts in Embodiments

In the following paragraph, non-limiting examples of correspondences between various elements recited in the claims below and those described above with respect to various preferred embodiments of the present invention are explained.

In the foregoing embodiments, the preamplifier 22 is an example of a circuit element or an amplifier, the suspension board 1 is an example of an external circuit or a suspension board with a circuit, the preamplifier mounting region R1*a* is an example of a mounting region, the base insulating layer 25 is an example of a first insulating layer or an insulating layer, the cover insulating layer 26 is an example of a second insulating layer, the connection pad 21*a* is an example of a first connection terminal, the connection pad 21*b* is an example of a second connection terminal, the wiring trace D1 is an example of a conductor line, the metal layer 24 is an example of a conductive layer, and the metal reinforcing plate 27 is an example of a metal plate.

As each of various elements recited in the claims, various other elements having configurations or functions described in the claims can be also used.

Figure 6:
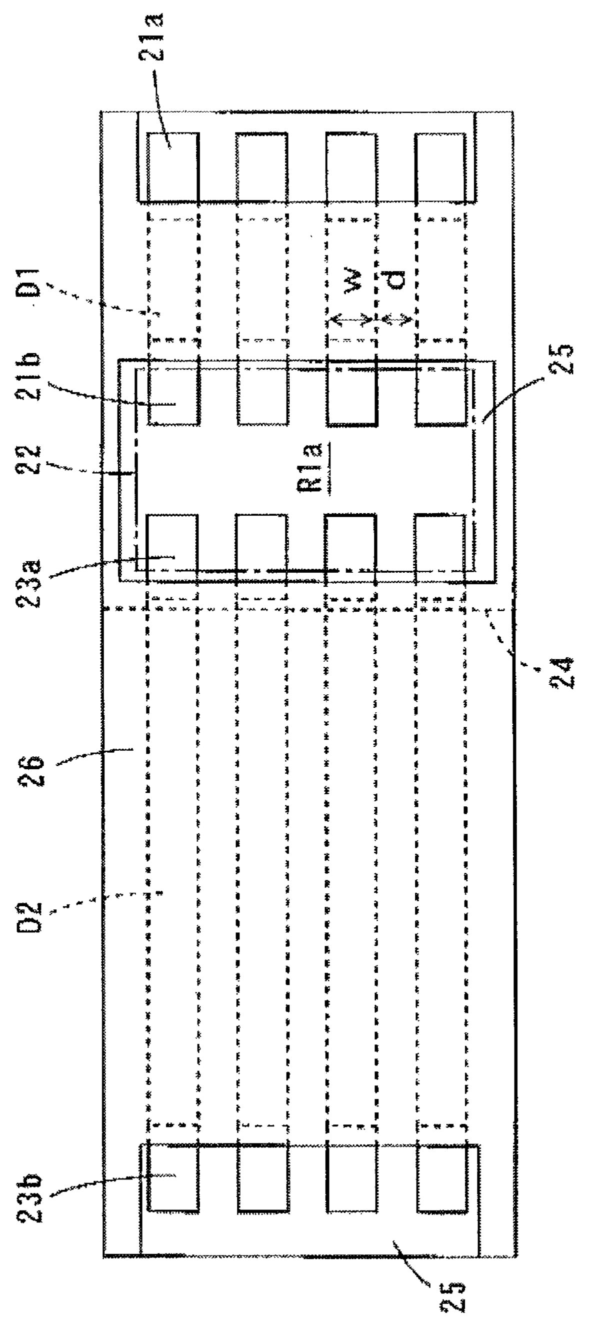
FIG. 6 is a schematic plan view and a schematic sectional view of the printed circuit board of each of inventive examples 1 to 8 and comparative examples 1 to 4.
Figure 6:
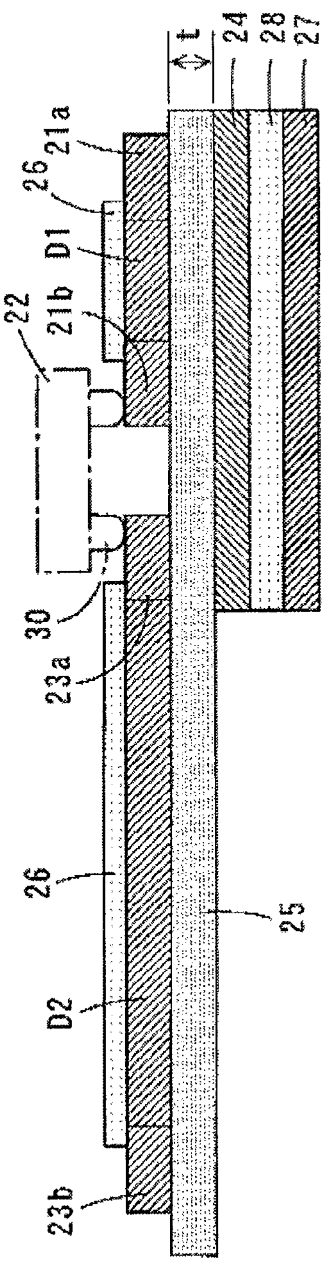

(5) Inventive Examples (5-1) Printed Circuit Boards of Inventive Examples and Comparative Examples In each of inventive examples 1 to 8 and comparative examples 1 to 4, a printed circuit board shown in FIG. 6 was manufactured based on the above-described embodiment. FIG. 6 (*a*) is a schematic plan view of the printed circuit board of each of the inventive examples 1 to 8 and the comparative examples 1 to 4, and FIG. 6 (*b*) is a schematic sectional view of the printed circuit board of each of the inventive examples 1 to 8 and the comparative examples 1 to 4. Note that FIG. 6 (*b*) shows a vertical cross section taken along the wiring trace D1 and the wiring trace D2.

In the printed circuit board of FIG. 6, the plurality of wiring traces D1 were formed in parallel with one another at regular intervals, and the plurality of wiring traces D2 were formed in parallel with one another at regular intervals on the base insulating layer 25. The cover insulating layer 26 was formed on the base insulating layer 25 to cover the wiring traces D1, D2 excluding the preamplifier mounting region R1*a*, the region in which the connection pads 21*a* were formed and the region in which the connection pads 23*b* were formed. The metal layer 24 was formed on the opposite surface of the base insulating layer 25. Furthermore, the metal reinforcing plate 27 is provided on the surface of the metal layer 24 on the opposite side of the surface in contact with the base insulating layer 25 while the adhesive 28 is sandwiched between the metal layer 24 and the metal reinforcing plate 27.

Figure 7A:
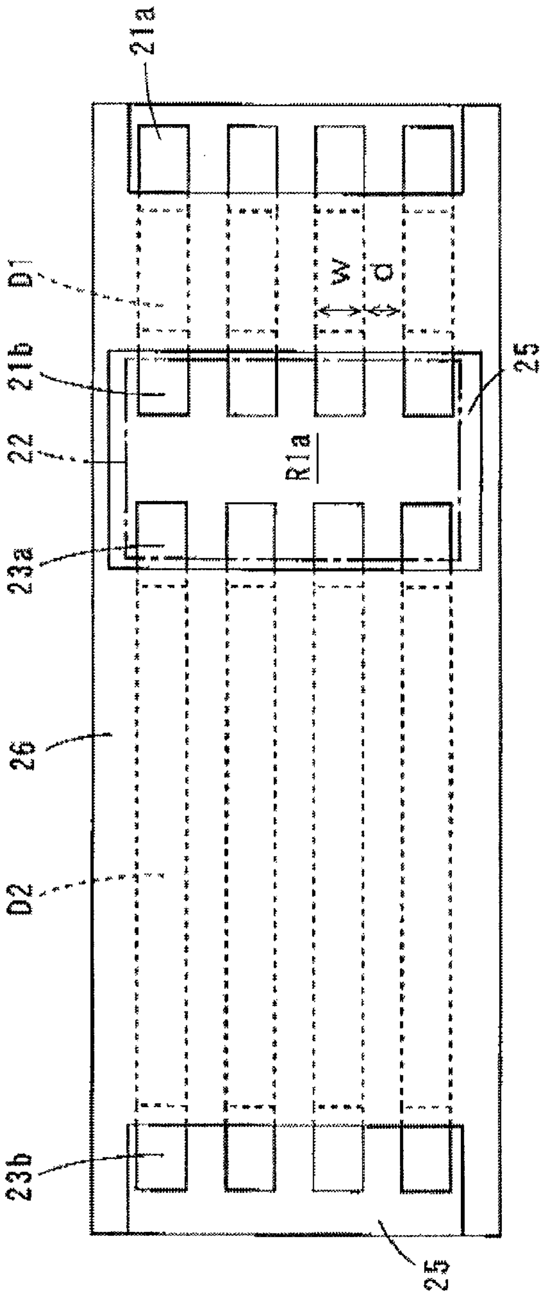
FIG. 7 is a schematic plan view and a schematic sectional view of a printed circuit board of a comparative example 5.
Figure 7B:
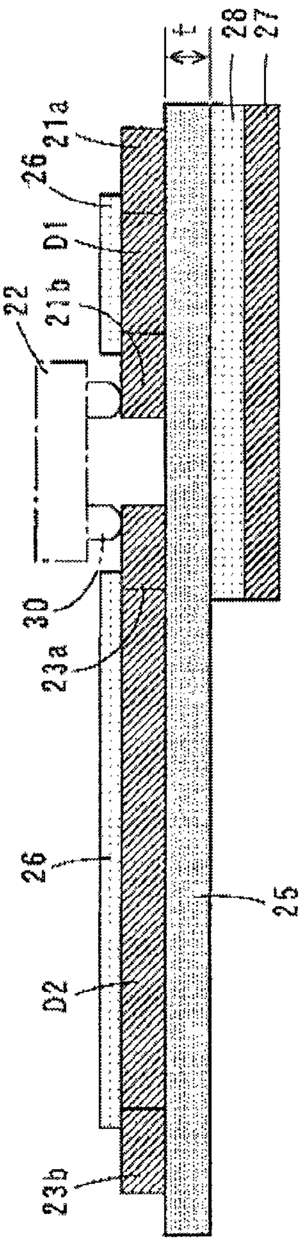

In a comparative example 5, the printed circuit board shown in FIG. 7 was manufactured. FIG. 7 (*a*) is a schematic plan view of the printed circuit board of the comparative example 5, and FIG. 7 (*b*) is a schematic sectional view of the printed circuit board of the comparative example 5. The printed circuit board of FIG. 7 has the same configuration as the printed circuit board of FIG. 6 except that the metal layer 24 is not formed on the opposite surface of the base insulating layer 25.

(5-2) The Differential Impedance of the Transmission Line Pair

The printed circuit boards having various differential impedances were manufactured by adjusting the widths w of the wiring traces D1, the distances d between the adjacent wiring traces D1 and the thicknesses t of the base insulating layer 25 in the inventive examples 1 to 6 and the comparative examples 1 to 3.

In the printed circuit board of the inventive example 1, the width w of the wiring trace D1 was 250 μm, the distance d between the adjacent wiring traces D1 was 8 μm, the thickness t of the base insulating layer 25 was 6 μm, and the thickness of the wiring trace D1 was 15 μm.

In the printed circuit board of the inventive example 2, the width w of the wiring trace D1 was 100 μm, the distance d between the adjacent wiring traces D1 was 10 μm, the thickness t of the base insulating layer 25 was 5 μm, and the thickness of the wiring trace D1 was 15 μm.

In the printed circuit board of the inventive example 3, the width w of the wiring trace D1 was 150 μm, the distance d between the adjacent wiring traces D1 was 10 μm, the thickness t of the base insulating layer 25 was 12.5 μm, and the thickness of the wiring trace D1 was 15 μm.

In the printed circuit board of the inventive example 4, the width w of the wiring trace D1 was 150 μm, the distance d between the adjacent wiring traces D1 was 15 μm, the thickness t of the base insulating layer 25 was 16 μm, and the thickness of the wiring trace D1 was 15 μm.

In the printed circuit board of the inventive example 5, the width w of the wiring trace D1 was 90 μm, the distance d between the adjacent wiring traces D1 was 10 μm, the thickness t of the base insulating layer 25 was 12.5 μm, and the thickness of the wiring trace D1 was 15 μm.

In the printed circuit board of the inventive example 6, the width w of the wiring trace D1 was 60 μm, the distance d between the adjacent wiring traces D1 was 20 μm, the thickness t of the base insulating layer 25 was 16 μm, and the thickness of the wiring trace D1 was 15 μm.

In the printed circuit board of the comparative example 1, the width w of the wiring trace D1 was 250 μm, the distance d between the adjacent wiring traces D1 was 8 μm, the thickness t of In the printed circuit board of the comparative example 2, the width w of the wiring trace D1 was 60 μm, the distance d between the adjacent wiring traces D1 was 30 μm, the thickness t of the base insulating layer 25 was 16 μm, and the thickness of the wiring trace D1 was 15 μm.

In the printed circuit board of the comparative example 3, the width w of the wiring trace D1 was 50 μm, the distance d between the adjacent wiring traces D1 was 50 μm, the thickness t of the base insulating layer 25 was 12.5 μm, and the thickness of the wiring trace D1 was 15 μm.

The differential impedances of the transmission line pairs of the printed circuit boards of the inventive examples 1 to 6 and the comparative examples 1 to 3 were measured by a TDR (Time Domain Reflectometry) method. Results of the measurement of the differential impedances are shown in Table 1.

TABLE 1

| | WIDTH [μm] OF WIRING TRACE | DISTANCE [μm] BETWEEN WIRING TRACES | THICKNESS [μm] OF BASE INSULATING LAYER | DIFFERENTIAL IMPEDANCE [Ω] |
|---|---|---|---|---|
| INVENTIVE EXAMPLE 1 | 250 | 8 | 6 | 10 |
| INVENTIVE EXAMPLE 2 | 100 | 10 | 5 | 20 |

TABLE 1-continued

| | WIDTH [μm] OF WIRING TRACE | DISTANCE [μm] BETWEEN WIRING TRACES | THICKNESS [μm] OF BASE INSULATING LAYER | DIFFERENTIAL IMPEDANCE [Ω] |
|---|---|---|---|---|
| INVENTIVE EXAMPLE 3 | 150 | 10 | 12.5 | 25 |
| INVENTIVE EXAMPLE 4 | 150 | 15 | 16 | 30 |
| INVENTIVE EXAMPLE 5 | 90 | 10 | 12.5 | 35 |
| INVENTIVE EXAMPLE 6 | 60 | 20 | 16 | 50 |
| COMPARATIVE EXAMPLE 1 | 250 | 8 | 3 | 5 |
| COMPARATIVE EXAMPLE 2 | 60 | 30 | 16 | 55 |
| COMPARATIVE EXAMPLE 3 | 50 | 50 | 12.5 | 80 |

As shown in Table 1, the differential impedances of the transmission line pairs of the printed circuit boards of the inventive examples 1 to 6 were 10Ω, 20Ω, 25Ω, 30Ω, 35Ω and 50Ω, respectively. Meanwhile, the differential impedances of the transmission line pairs of the printed circuit boards of the comparative examples 1 to 3 were 5Ω, 55Ω and 80Ω, respectively.

The results of the inventive examples 1 to 6 and the comparative examples 1 to 3 show that the differential impedance of the transmission line pair of the printed circuit board can be set to not less than 10Ω and not more than 50Ω by appropriately selecting the width w of the wiring trace D1, the distance d between the adjacent wiring traces D1 and the thickness t of the base insulating layer 25.

(5-3) Distance between the Wiring Traces

The printed circuit boards having different distances d between the adjacent wiring traces D1 were manufactured in an inventive example 7 and a comparative example 4. The distance d between the adjacent wiring traces D1 was 8 μm in the inventive example 7, and the distance d between the adjacent wiring traces D1 was 5 μm in the comparative example 4.

Ion migration between the wiring traces D1 were tested by applying a DC voltage of 60 V between the adjacent wiring traces D1 under an atmosphere of 85° C. and 85% RH (Relative Humidity) in the printed circuit boards of the inventive example 7 and the comparative example 4. Results of the ion migration test are shown in Table 2.

TABLE 2

| | DISTANCE [μm] BETWEEN WIRING TRACES | PRESENCE/ABSENCE OF DECREASE IN INSULATION RESISTANCE |
|---|---|---|
| INVENTIVE EXAMPLE 7 | 8 | ABSENT |
| COMPARATIVE EXAMPLE 4 | 5 | PRESENT |

As shown in Table 2, the insulation resistance between the wiring traces D1 did not decrease even though an application time period of the DC voltage exceeds 1000 hours in the printed circuit board of the inventive example 7. Meanwhile, the insulation resistance between the wiring traces D1 decreased when the application time period of the DC voltage reaches 800 hours, and short circuits occurred between the wiring traces D1 in the printed circuit board of the comparative example 4.

It has been apparent from the results of the inventive example 7 and the comparative example 4 that the insulation resistance between the wiring traces D1 might decrease when the distance between the wiring traces D1 of the printed circuit board was smaller than 8 μm.

(5-4) Effects of the Metal Layer

The printed circuit board of FIG. 6 having the metal layer 24 and the printed circuit board of FIG. 7 not having the metal layer 7 were manufactured in an inventive example 8 and a comparative example 5. The width w of the wiring trace D1 was 90 μm, the distance d between the adjacent wiring traces D1 was 10 μm, the thickness t of the base insulating layer 25 was 12.5 μm, and the thickness of the wiring trace D1 was 15 μm in the inventive example 8 and the comparative example 5. In the printed circuit board of FIG. 6, the metal reinforcing plate 27 having the thickness of 500 μm was provided on the surface of the metal layer 24 on the opposite side of the surface in contact with the base insulating layer 25 while the adhesive 28 having the thickness of 25 μm is sandwiched between the metal layer 24 and the metal reinforcing plate 27. In the printed circuit board of FIG. 7, the metal reinforcing plate 27 having the thickness of 500 μm was provided on part of the other surface of the base insulating layer 25 with the adhesive 28 having the thickness of 25 μm sandwiched therebetween.

The differential impedances of the transmission line pairs of the printed circuit boards of the inventive example 8 and the comparative example 5 were measured by the TDR method. Results of the measurement of the differential impedances are shown in Table 3.

TABLE 3

| | PRESENCE/ABSENCE OF METAL LAYER | DIFFERENTIAL IMPEDANCE [Ω] |
|---|---|---|
| INVENTIVE EXAMPLE 8 | PRESENT | 31 Ω |
| COMPARATIVE EXAMPLE 5 | ABSENT | 53 Ω |

As shown in Table 3, the differential impedance of the transmission line pair of the printed circuit board of the inventive example 8 was 31Ω. On the other hand, the differential impedance of the transmission line pair of the printed circuit board of the comparative example 5 was 53Ω.

The results of the inventive example 8 and the comparative example 5 show that the differential impedance of the transmission line pair can be decreased to not more than 50Ω by providing the metal layer 24 so as to be opposite to the wiring traces D1 with the base insulating layer 25 sandwiched therebetween.

It has been apparent from the results of the inventive examples 1 to 8 and the comparative examples 1 to 5 that the differential impedance of the transmission line pair can be decreased to not more than 50Ω and the insulation reliability between the wiring traces D1 can be ensured by setting the width w of the wiring trace D1 to not more than 250 μm, setting the distance d between the adjacent wiring traces D1 to not less than 8 μm, adjusting the thickness t of the base insulating layer 25, and providing the metal layer 24 so as to be opposite to the wiring traces D1 with the base insulating layer 25 sandwiched therebetween.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board on which a circuit element is mounted and to which an external circuit is connected, comprising:

a first insulating layer having a mounting region, in which the circuit element is mounted, on one surface;

a plurality of first connection terminals that are formed in a region, which excludes said mounting region, on said one surface of said first insulating layer and that can be connected to said external circuit;

a plurality of second connection terminals that are formed in said mounting region on said one surface of said first insulating layer and that can be connected to a plurality of terminals of said circuit element, respectively;

a plurality of conductor lines that are formed to extend between said plurality of first connection terminals and said plurality of second connection terminals on said one surface of said first insulating layer; and a conductive layer that is formed in a region on the other surface of said first insulating layer that is opposite to a region on said one surface of said first insulating layer including said plurality of conductor lines, wherein adjacent conductor lines constitute a transmission line pair, a width of each conductor line is set to not more than 250 μm, a distance between the adjacent conductor lines is set to not less than 8 μm, and differential impedance of the transmission line pair is not less than 10 Ω and not more than 50 Ω.

2. The printed circuit board according to claim 1, wherein a thickness of said first insulating layer is not less than 4 μm and not more than 30 μm.

3. The printed circuit board according to claim 1, further comprising a metal plate provided on one surface of said conductive layer.

4. The printed circuit board according to claim 1, further comprising a second insulating layer formed on said one surface of said first insulating layer to cover said plurality of conductor lines.

5. The printed circuit board according to claim 1, wherein said first insulating layer is made of polyimide.

6. A magnetic head driving device comprising:

a printed circuit board;

an amplifier having a plurality of terminals;

a suspension board with a circuit; and a magnetic head provided on said suspension board with the circuit, wherein said printed circuit board includes:

an insulating layer having a mounting region on one surface;

a plurality of first connection terminals formed in a region, which excludes said mounting region, on said one surface of said insulating layer and that can be connected to said suspension board with the circuit;

a plurality of second connection terminals formed in said mounting region on said one surface of said insulating layer;

a plurality of conductor lines that are formed to extend between said plurality of first connection terminals and said plurality of second connection terminals on said one surface of said insulating layer; and a conductive layer formed in a region on the other surface of said insulating layer so as to be opposite to a region on said one surface of said insulating layer including said plurality of conductor lines, adjacent conductor lines constitute a transmission line pair, a width of each conductor line is set to not more than 250 μm, a distance between the adjacent conductor lines is set to not less than 8 μm, and differential impedance of the transmission line pair is not less than 10 Ω and not more than 50 Ω, said amplifier is mounted in said mounting region of said insulating layer, said plurality of terminals of said amplifier are connected to said plurality of second connection terminals, and said magnetic head is electrically connected to said plurality of first connection terminals through said suspension board with the circuit.

* * * * *